United States Patent [19]

Fernandes et al.

[11] Patent Number: 4,814,767

[45] Date of Patent: Mar. 21, 1989

[54] SUB-RANGING A/D CONVERTER WITH FLASH CONVERTER HAVING BALANCED INPUT

[75] Inventors: John W. Fernandes, Beverly, Mass.; Gerald A. Miller, Hudson, N.H.; Andrew M. Mallinson, Billerica, Mass.

[73] Assignee: Analog Devices, Inc., Norwood, Mass.

[21] Appl. No.: 106,712

[22] Filed: Oct. 8, 1987

[51] Int. Cl.⁴ .............................................. H03M 1/34
[52] U.S. Cl. .................................... 341/158; 341/110; 341/155
[58] Field of Search ............... 340/347 AD, 347 DA, 340/347 M; 341/110, 126, 155, 163, 158

[56] References Cited

U.S. PATENT DOCUMENTS 4,441,096  4/1984  Evanchuk .................. 340/347 AD
4,544,917  10/1985  Lenhoff, Jr. ............... 340/347 AD

OTHER PUBLICATIONS

The Engineering Staff of Analog Devices, Inc.; "Analog-Digital Conversion Notes"; 1977, pp. 125–126.
Shih et al, "Reference Refreshing Cyclic Analog-to-Digital and Digital-to-Analog Converters", IEEE Journal of Solid-State Circuits, vol. SC-21, No. 4, Aug. 1986, pp. 544–554.
Gordon, "Linear Electronic A/D Conversion Architectures, Their Origins, Parameters, Limtations, and Applications," IEEE Trans. Circuits & Syst. vol. CAS-25 pp. 391–418, Jul. 1978.

Primary Examiner—William M. Shoop, Jr
Assistant Examiner—Richard K. Blum
Attorney, Agent, or Firm—Parmelee, Bollinger & Bramblett

[57] ABSTRACT

A 12-bit sub-ranging A/D converter which operates through four successive sub-ranging cycles with an 8:1 gain change between the cycles. The residue signal for each cycle is directed to a four-bit flash converter the output of which sets the latches for corresponding bit-current-sources of a DAC. The flash converter input circuit comprises identical residue and reference amplifiers driving symmetrical residue and reference networks for controlling the flash converter comparators. The DAC output for each cycle is compared with the analog input signal to produce a corresponding new residue signal. There are 15 bit-current-sources, three for the first cycle, and four for each of the last three cycles. The MSB of each group of four bit-current sources is an overlap bit having the same current weighting as the LSB of the preceding group. Setting of the overlap bit makes it possible to develop a correct output for the DAC for each of the 2nd through 4th cycles without altering bits already determined in previous cycles. The converter provides an optional 5th cycle making possible a 14-bit output or an increased yield of 12-bit converters.

29 Claims, 5 Drawing Sheets

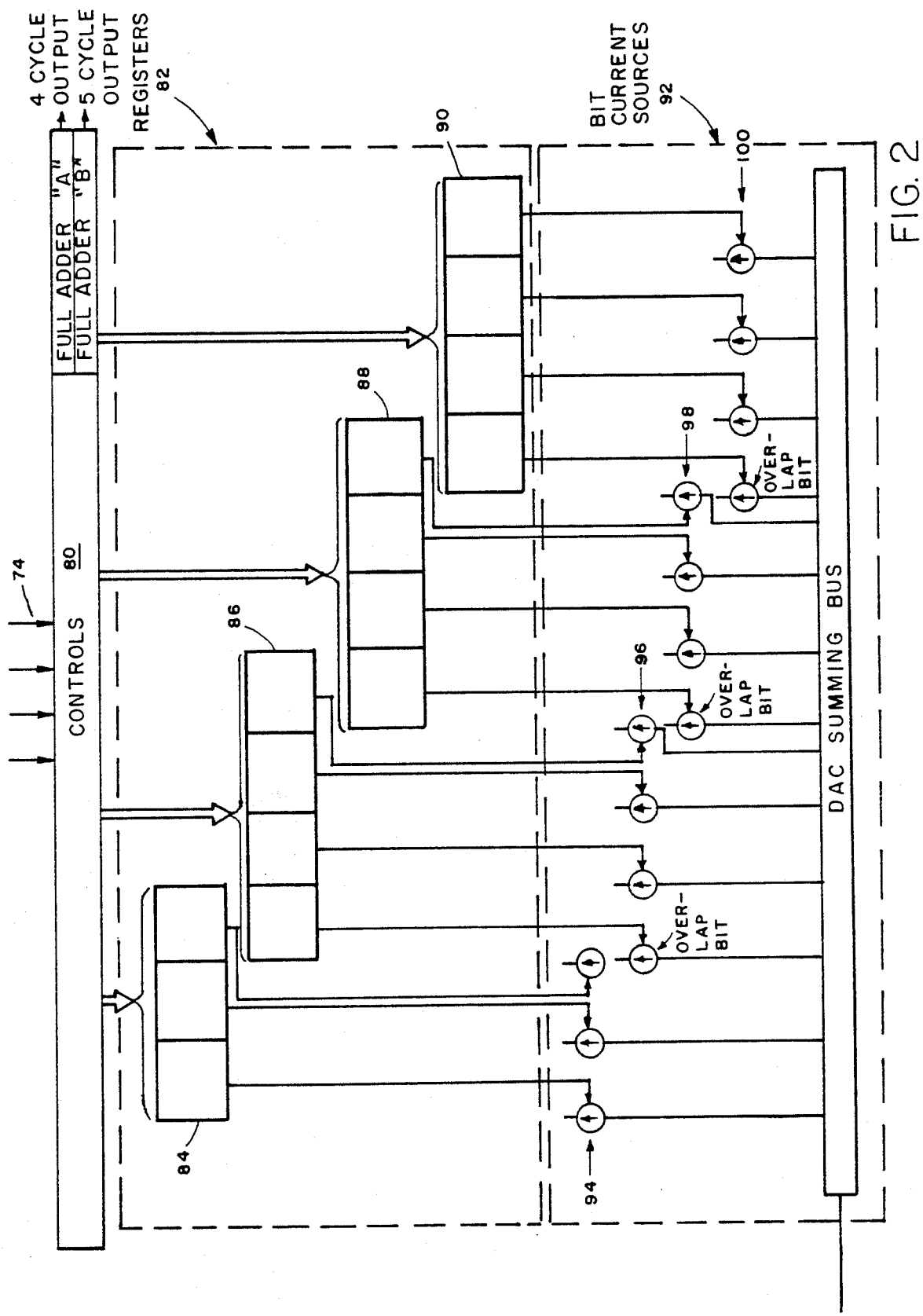

SUB-RANGING A/D CONVERTER WITH FLASH CONVERTER HAVING BALANCED INPUT

BACKGROUND OF THE INVENTION

1. Field of the Invention

This invention relates to analog-to-digital (A/D) converters. More particularly, this invention relates to such converters which are capable of fast conversion to at least 12-bit resolution, and which are formed monolithically as an integrated-circuit (IC) chip.

2. Description of the Prior Art

A wide variety of monolithic A/D converters have been proposed heretofore, but none has met the need for high-speed conversion with at least 12 bits resolution. For example, it has been known that high speed conversion can be effected through the use of so-called flash converters, wherein all of the output bits are determined essentially simultaneously. However, to achieve the desired 12-bit resolution with a flash converter would require $2^{12}-1$ (or 4095) comparators, which is not practical in a monolithic realization.

It also is known that the total number of comparators in a flash converter can be reduced by operating such a converter through a sequence of "sub-ranging" cycles wherein the converter in the first cycle determines a first set of higher-order bits, and in subsequent cycles determines respective sets of lower-order bits so as to produce a final digital output signal as a composite of the digital outputs developed during the successive cycles. At the end of each cycle the flash converter digital output is supplied to a D/A converter which produces an analog output to be subtracted from the analog input signal to produce a "residue" error signal for the next cycle conversion. The number of bits developed by the flash converter in each such sub-ranging cycle is only a fraction of the number of bits in the final composite digital output, and thus much fewer comparators are needed.

Although the principle of such sub-ranging A/D converters is well known, no fully commercially satisfactory 12-bit (or higher resolution) converter of that type has been provided in monolithic form. Examination of the technical requirements for such a converter will make it evident that a number of serious problems must be overcome to produce a converter having the requisite accuracy, resolution and speed. It is a general object of the present invention to solve those problems.

One particularly difficult problem is the need to overcome the performance inadequacies of flash converter designs known heretofore. For example, such converters commonly have suffered from poor dynamic response chracteristics, with the response being dependent upon input signal level. Also, the comparators in prior art designs typically did not all respond identically, e.g. due to differences in base current loading among the comparators.

Another serious obstacle in providing a monolithic sub-ranging A/D converter is the relatively large gain change required to achieve the different flash resolutions for the sequence of sub-ranging cycles. For example, for a 12-bit converter operated at 3-bits per sub-ranging cycle, the total net gain change between the first and fourth cycles must be 1:512. This is very difficult to achieve in conventional ways.

A still further problem is encountered in providing an acceptable arrangement for amplifying the "residue" error, i.e. the difference between the analog input signal and the analog output of the D/A converter controlled by the flash converter. Conventionally, the residue amplifier would be an op amp referenced to zero (ground), and connected in a negative feedback circuit. However, it is very difficult to achieve satisfactory operation with such a circuit in monolithic format.

SUMMARY OF THE INVENTION

In a preferred embodiment of the present invention, to be described in detail hereinafter, the above and other problems have been solved or significantly mitigated. This preferred embodiment provides a sub-ranging converter operable through at least four cycles. For a 12-bit converter, each cycle develops 3 bits of the final output signal. Thus, the resolution of the converter must be increased by a 3-bit factor at the start of each new cycle, i.e. by a factor of 8:1.

The converter system includes a flash converter with a set of comparators (15, in the preferred arrangement). The comparator input terminals are supplied with both input and reference signals through respective symmetrical resistance networks supplied with identical bias currents. These networks are so configured as to provide equal base current loading, i.e. with both input terminals of each comparator seeing the same source impedance. In the final sub-ranging cycle of operation, where the "residue" error is reduced to near zero, the logic decision is made by the comparator in the center of the comparator string. This helps to assure consistent results regardless of the magnitude of the input signal.

The required 8:1 change in resolution from cycle to cycle is effected in two different ways. Between the first and the second cycles, the reference currents supplied to the two resistance networks for the comparators are switched to different points of the networks, so as to increase the flash converter resolution by a factor of 8:1. Between the second and the third cycles, the resistance network reference currents are returned to their original application points, and the gain of the residue amplifier is increased by a factor of 64:1. In going from the third to the fourth cycle, the network reference currents are again switched as in the second cycle, and this, together with the already-set net amplifier gain increase of 64:1, results in an overall gain change of 512:1. This multi-variable approach (using both amplifier gain change and reference current change) reduces the technical difficulties in achieving the relatively large overall net change in gain required, thus enhancing the performance capability of the system.

The amplification arrangement in the preferred embodiment comprises separate residue and reference amplifiers driving the input and reference resistance networks for the string of flash converter comparators. These amplifiers are operated "open-loop", rather than closed loop as in prior art devices. (Note: The amplifiers do have internal closed-loop feedback in the input stage, to hold the emitters of an output transistor at ground potential, but the output signal is not fed back to the input of the amplifier.) However, the residue and reference amplifiers have matched characteristics so that common mode errors are essentially avoided, notwithstanding the absence of feedback control as in prior art designs. Excellent matching of amplifier characteristics can readily be achieved in monolithic format. Thus, this amplifier design can handle without difficulty the relatively large gain change needed to accommodate the required changes in resolution.

The flash converter in the preferred embodiment produces 4 bits per cycle, but only 3 bits of the final digital output are actually generated per cycle. The additional range provided by the extra bit (which is the most significant bit of the 4 bits produced in cycles two through four) permits fast conversion with high precision. This extra bit has the same current level as the least significant bit (LSB) in the preceding cycle. That is, the most significant bit "overlaps" the previous LSB, and is set by the flash converter so as to produce a correct result without altering bits already set in a previous flash code.

Advantageously, this compensation is carried out in an analog fashion. More particularly, the 12-bit DAC forming part of the overall system is constructed so as to have 15 bit-current-sources. The additional three current sources provide duplicates of the current sources for bits 3, 6 and 9 of the basic 12-bit converter. All 15 bit-current-sources are controllable by a 15-bit register built as part of the DAC. When the effect of a bit set in a previous cycle requires compensation, this can be done during the next cycle without changing the previously set bit. Thus, no digital summation is required between cycles.

In operating the preferred embodiment, all of the regular bit-current-sources are turned on at the start of a conversion, and the overlap bit-current-sources are turned off. During the second through fourth cycles, any positive residue resulting from the previous cycle results in turning on the overlap bit (i.e. the most significant bit of the group of 4 bits) and the other 3 bits as required, while any negative residue is taken care of by setting the other 3 bits of the 4-bit group without turning on the overlap bit.

The disclosed embodiment also has the capability of being operated through a fifth cycle provided a yet higher resolution, such as may be produced by reducing still further the reference current flowing through the residue and reference resistance networks. This makes it possible to produce two additional bit outputs so as to provide a 14-bit converter, or to assure an increased yield of 12-bit converters.

Other objects, aspects and advantages of the invention will in part be pointed out in, and in part apparent from, the following description considered together with the accompanying drawings.

BRIEF DESCRIPTION OF THE DRAWINGS

FIG. 2 is a diagrammatic representation of details of the DA shown in FIG. 1.

DETAILED DESCRIPTION OF A PREFERRED EMBODIMENT

Figure 1A:
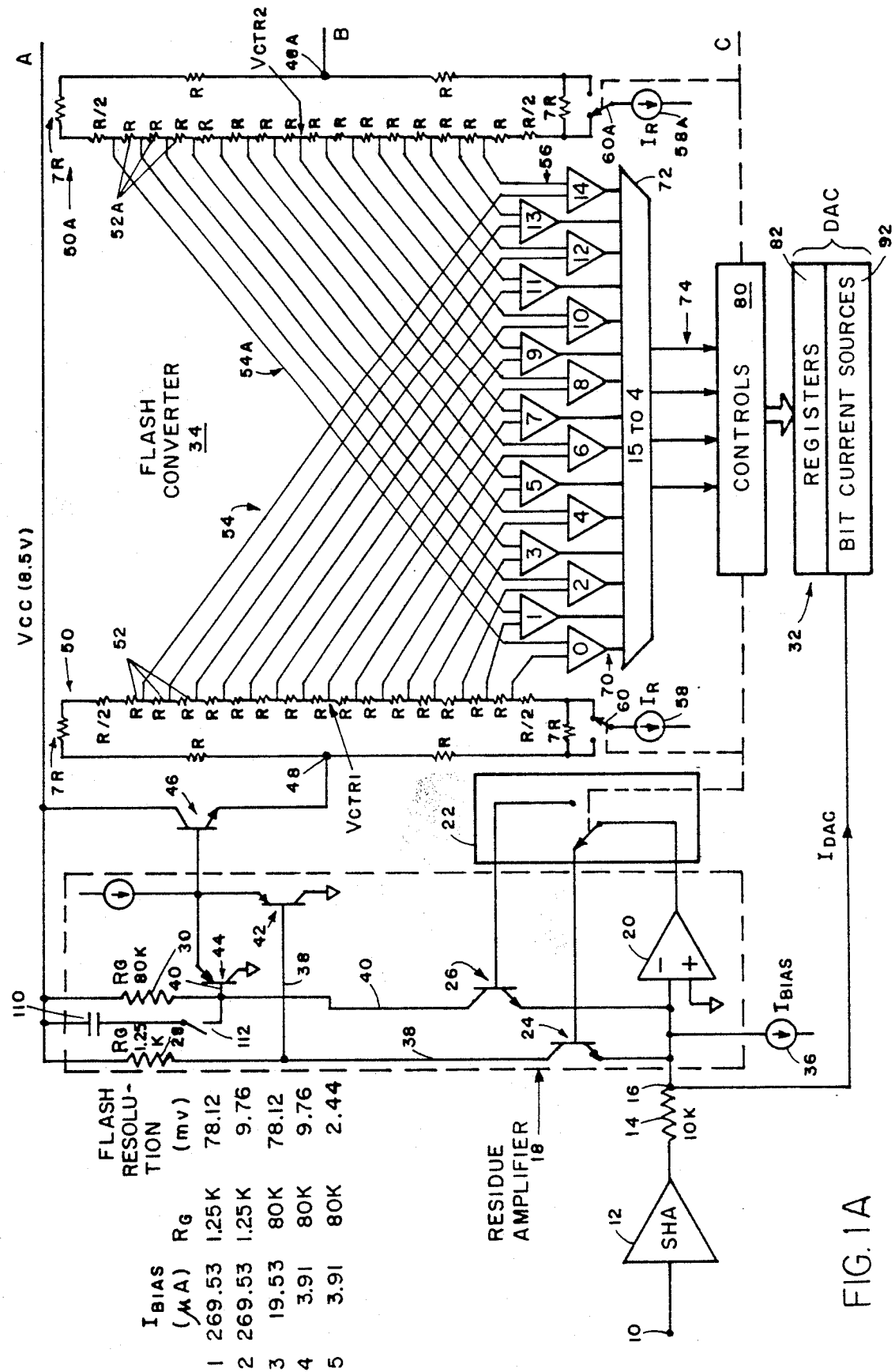
FIGS. 1A and 1B together present a block diagram showing the overall arrangement of the A/D converter in this invention.
Figure 1B:
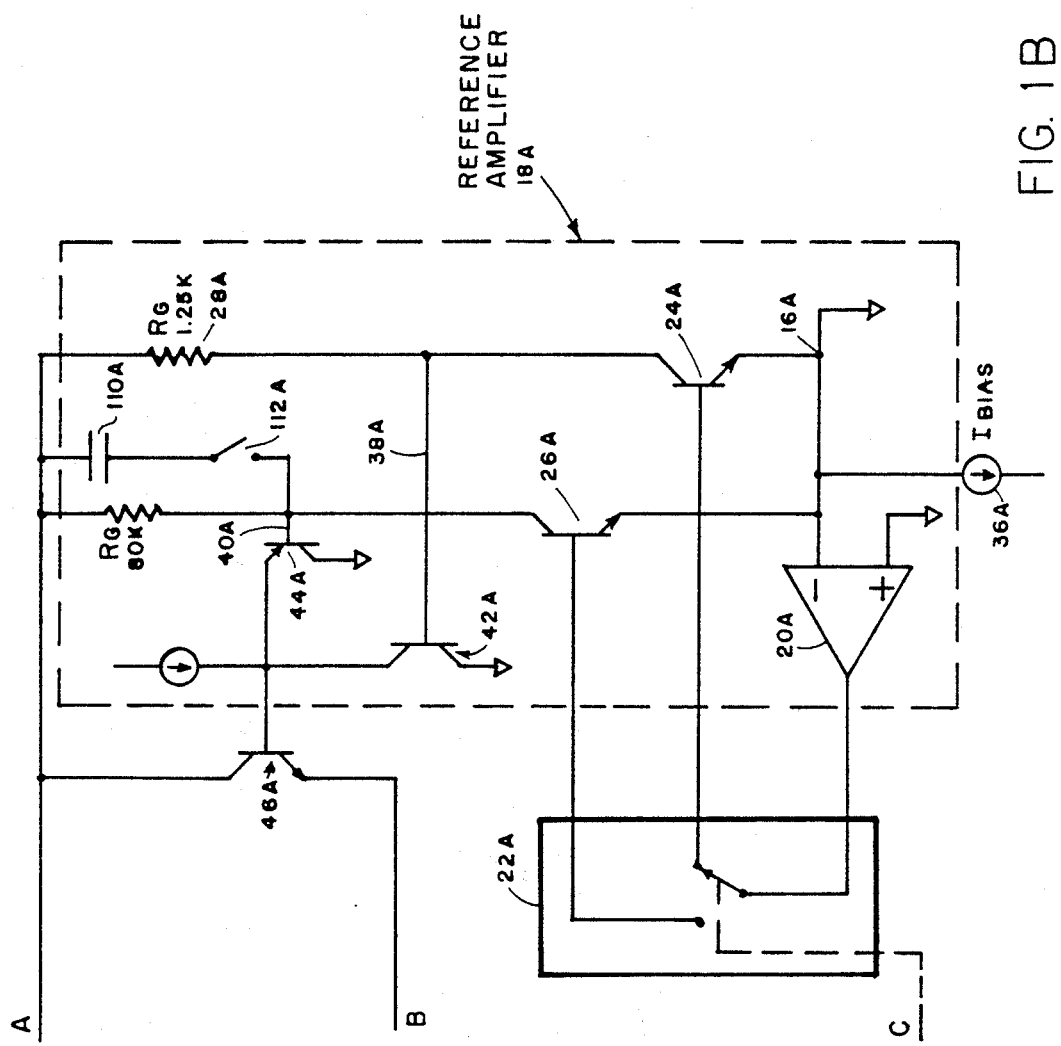

Referring now to the left-hand edge of FIG. 1, an analog signal to be converted is applied to the input terminal 10 of a sample-and-hold amplifier (SHA) 12 having the usual timed control signals. The SHA output is held at its sample level for a time period sufficiently long to carry out an analog-to-digital conversion as will be explained. The sample level is updated periodically in response to the SHA control signals.

The output of the SHA is applied to a resistor 14 to produce a corresponding current at a summing node 16 which serves as the input terminal of a residue amplifier generally indicated at 18. Within the amplifier 18, the summing node 16 is connected to the inverting input of an op amp 20. The output of this op amp is directed to a make-before-break gain switch 22 which selectively connects the op amp output to the base of one or the other of two transistor amplifiers 24, 26. The emitters of both transistors are returned to the summing node 16, to complete corresponding feedback circuits around the op amp 20. The collectors of the transistors are connected to $V_{cc}$ (8.5 volts) through respective load resistors $R_G$ (28, 30) the ohmic resistances of which are in the ratio of 1:64.

The summing node 16 also is connected to the output of a D/A converter (DAC) 32, the digital input to which is controlled by a flash converter 34 in a manner to be explained. The DAC output current $I_{DAC}$ is subtracted from the input current flowing through the resistor 14 to produce an error or "residue" signal at the summing node. A bias current source 36 also is connected to the summing node 16 to assure that under all input conditions current will flow down through the selected transistor 24 or 26 so that the transistor remains in its linear region of operation.

Under these conditions, the current through the transistor 24 or 26 selected by the output switch 22 will correspond directly to the residue signal at the summing node 16. The selected transistor thus will produce on its output line 38, 40 an amplified output voltage signal corresponding to the residue signal. The magnitude of this amplified signal depends upon which transistor 24 or 26 and associated load resistor $R_G$ is selected. For a given residue signal, the output signal from transistor 26 will produce an amplified residue signal which is 64 times as large as that from transistor 24.

The output lines 38, 40 are coupled through respective buffer transistors 42, 44 and a common transistor 46 to the terminal 48 of an input resistance network 50 for the flash converter. Only one of the buffer transistors 42 or 44 is active at a time, depending upon which transistor amplifier 24 or 26 has been selected by the switch 22. For example, when the left-hand transistor amplifier 24 is turned off by the switch 22 being shifted to the alternate connection path (shown as not active in FIG. 1A), no current will flow through the left-hand load resistor $R_G$ connected to output line 38. Thus, buffer transistor 42 goes off, and the base of common transistor 46 is controlled by the output of the other buffer transistor 44.

The network 50 includes at its right-hand side a string of equal-valued resistors 52 serving as a voltage divider, and having output nodes between each resistor for signal lines 54 leading to respective input terminals of a set of 15 comparators 56 forming part of the flash converter. A current source 58 is connected to the lower end of the network 50 to produce a flow of current through the voltage divider 52, to establish predetermined internodal tap voltages therebetween. A switch 60 provides for changing the application point of the current source to the network, so as to change the current flow through the voltage divider.

In a particular version of the preferred embodiment, the current source 58 produced, with the switch 60 in the position shown, a current through the divider resistors 52 of 125 μA. This developed 78.12 mv between the divider nodes for resistor values of R=⅝K. In the alternative position of the switch 60, the divider current flow is decreased by a factor of 8:1 to 15.62 μA, producing 9.76 mv between the divider nodes.

The residue signal applied to the input transistor 46 changes the voltage at the top of the voltage divider in correspondence to the magnitude (and sign) of the residue signal. That is, the voltages developed at the divider nodes move up or down, in unison, with changes in the residue signal, while maintaining the same internodal difference voltage.

To provide a symmetrical balanced input to the comparators 56, reference voltages are supplied to the right-hand comparator terminals by a resistor network 50A which is identical to the network 50 already described. This reference network also is supplied with current by a current source 58A identical to source 58, through a switch 60A like switch 60. The reference network is driven by an arrangement of amplifiers and a gain-changing switch 22A which are identical to those used to drive the residue network 50, and in the drawing like components are labelled with the same reference number having a suffix letter A.

The fifteen comparators 56 produce on their output lines 70 corresponding binary output signals representing the magnitude of the residue signal developed at the node 16 and applied to the transistor 46. The comparator outputs are converted to a 4-bit Gray code in logic circuit 72. The Gray code is in turn converted to a 4-bit natural binary signal on the output lines 74 of the logic circuit 72.

If the residue signal is zero (i.e. if the DAC current $I_{DAC}$ is equal to the current produced at node 16 by the input signal), the first seven comparators (0 through 6) will produce "high" outputs, and the remaining eight (7 through 14) will produce "low" outputs. Thus, the breakpoint decision for zero residue is made at the center comparator No. 7, which receives its inputs from $V_{CTR1}$ of network 50 and $V_{CTR2}$ of network 50A. Although these networks are identical, it will be seen that the two $V_{CTR}$ points are offset from one another by one resistor R. Thus, all comparators will receive a ½ LSB offset, to round-up the digital output of the flash converter.

The following gives an example of how the outputs of the comparators 56 can be determined for the specific embodiment described herein: When the residue signal is zero, the current flowing through the transistor 24 will be only the bias current from the source 36. In the preferred embodiment, this current is 269.53 μA (in cycle #1). Under these circumstances the voltage at the input terminal 48 of the residue network 50 will be 8.5 ($V_{CC}$) less the voltage drop agross $R_G$ ($I_{bias} \times R_G = 269.53 \times 1.25K = 0.337$), and up and down diode drops across transistors 42 and 46 (which cancel each other), giving a resulting voltage of 8.163 V. The drop across the entire residue string is 1.875 V.

The voltage at $V_{CTR1}$ is 8.163 less 125 μA×115/16K=6.952 V. The voltage at $V_{CTR2}$ will be lower than that at $V_{CTR1}$ by 125 μA×⅝KΩ. Thus, $V_{CTR2}$ will be 6.952−78 mV=6.874 V. The two inputs of comparator 7 would therefore be 6.952 V and 6.874 V. By similar calculations, the inputs at comparator #8 will be 7.030 V and 6.796 V, while the inputs of comparator #6 will be 6.874 V and 6.952 V. Accordingly, comparators 0 through 6 will all be set to one polarity (e.g. "high") while comparators 7 through 14 will be set to the opposite polarity (e.g. "low").

If the residue signal at transistor 46 increases from zero positively, the voltages on the nodes of the residue network 50 increase correspondingly, so that comparators 7 through 14 would progressively switch from "low" to "high". Similarly, if the residue signal increases from zero negatively, the other comparators (starting with #6) would progressively switch from "high" to "low".

The comparator output signals on lines 70 produce corresponding 4-bit natural binary signals on logic circuit output lines 74. These four bits represent the output of the flash converter 34. That is, the four bits of this signal represent the magnitude of the residue signal initially developed at the summing node 16. The possible four-bit codes are shown in Table I.

TABLE I

| FOUR BIT CODE | |
|---|---|
| 1111 | |
| 1110 | |
| 1101 | |
| 1100 | Positive Residues |
| 1011 | |
| 1010 | |
| 1001 | |
| 1000 | |
| 0111 | (Zero Residue) |
| 0110 | |
| 0101 | |
| 0100 | |
| 0011 | Negative Residues |
| 0010 | |
| 0001 | |
| 0000 | |

The 4-bit flash convert output on lines 74 is directed to a set of logical controls 80 which include timing controls and other associated elements for carrying out the sequenced cyclic procedures described herein. These controls employ conventional devices which function in a fashion well known to persons skilled in this art, and thus will not be described in detail.

One of the functions of the controls 80 is to direct the natural binary output bits 74 of the flash converter 34 to one of a set of registers 82 of the DAC 32. Referring now to FIG. 2, there are four registers 84, 86, 88 and 90, one for each of the four cycles of the conversion sequence. The first register 84 includes only 3 bits, because the full-scale input voltage (10 volts) is covered by the lower eight codes, i.e. from 0000 to 0111. If the flash output in the first cycle includes a "1" as the most significant bit (MSB), it would indicate that an error had occurred, such as that a voltage greater than 10 volts had been applied to the converter input.

At the start of conversion, bit-current-sources 92 (FIG. 1) of the DAC 32 are all turned on, producing a current of 0.999756 ma at the input summing node 16. If the converter input signal is 10 volts, the input current at the node 16 will be 1 ma, which (essentially) equals the DAC current, i.e. the residue signal will be zero. This causes the flash converter 34 to produce the output code 0111, of which (returning to FIG. 2) the bits "111" would be stored in the 3-bit 1st-cycle register 84. Each of the other three registers 86, 88 and 90 has four bits, to receive the four bits of the flash output during cycles 2, 3 and 4 of the converter sequencing.

Each of the four registers 84, 86, 88, 90 controls a respective set of bit-current-sources 94, 96, 98 and 100 of the DAC 32. These current sources are simply shown diagrammatically in FIG. 2, but can be of any detailed circuit configuration known in this art to produce constant output currents having the usual binary relationship (8:4:2:1 for the four sources of each quad).

As noted on FIG. 2, the MSB of three of the current-source sets 96, 98 and 100 is referred to as the "overlap bit". That bit has the same current weighting as the least significant bit (LSB) of the preceding current source set 94, 96 and 98, and thus is shown in FIG. 2 directly beneath the preceding LSB source. Although all of the normal (non-overlap) bit-current-sources are turned on by the controls 80 at the start of conversion, the overlap bits are all initially turned off.

During each of the four sequential cycles of a complete conversion, the residue signal (i.e. at the summing node 16, or at the input to transistor 46) can be either positive or negative. If the residue signal is negative (see Table I above), the MSB of the 4-bit output of the flash converter 34 will be a "zero". (In the 1st cycle, as explained above, the MSB of the 4-bit flash signal is always zero unless an error has occurred.) In the 2nd through 4th cycles, the MSB is stored in the left-hand cell of the corresponding register 86, 88 or 90 (FIG. 2). If that MSB is a zero, the stored signal will not alter the state of the corresponding "overlap bit" of the bit-current-sources 92. That is, the overlap bit will remain off when the flash converter MSB is zero.

On the other hand, if the residue signal is positive, the MSB of the 4-bit flash output will be a "one" (Table I above). When stored in the corresponding register cell (in cycles 2 through 4), this bit will turn on the respective "overlap bit" current source, thus adding to the DAC output ($I_{DAC}$) a current having a weight equal to the LSB of the preceding set of bit-current-sources 92. This has the effect of adding one LSB to the preceding 3-bit group of bits. In other words, turning on the overlap bit produces the same end result, with respect to the DAC current $I_{DAC}$, as would be digital addition with binary carry.

For example, if the 3-bit number produced during cycle #2 were "101", turning on the overlap bit as a result of the processes of cycle #3 would produce an additional increment of output current which, when combined with that from the previously-activated bit-current-sources 94, would create a net output current equal to that produced if the preceding 3-bit binary number were "110" (the next number up from 101). It may particularly be noted that this composite result is achieved in the analog domain, i.e. there is no need to employ the usual digital adder circuitry operative between cycles to combine each preceding 3-bit number with the subsequent digital number developed by the flash converter 34. This analog operation is especially advantageous in speeding up the overall analog-to-digital conversion, and avoids altering bits already determined in previous cycles, thereby to reduce glitches.

Returning now to the description of the converter operation, at the start of a conversion the normal (i.e. non-overlap) bit-current-sources 92 are all turned on, as mentioned previously. This is done simply in order to provide additional bias current through the transistor 24 sufficient to assure operation in the linear region without requiring a large bias current source 36. Turning on the bit-current-sources does not affect the basic functioning of the converter, which could operate satisfactorily with different initial conditions.

Figure 3A:
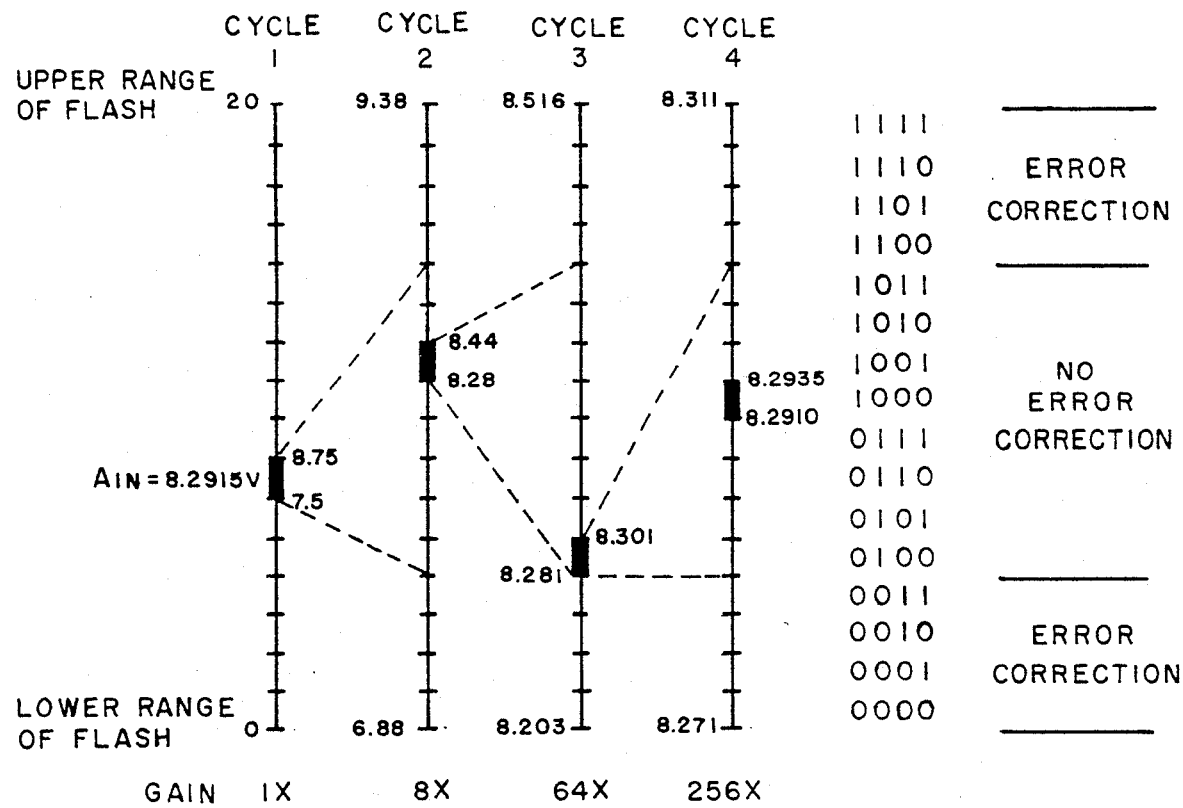
FIGS. 3A and 3B are graphical presentations to aid in describing the operation of the converter.
Figure 3B:
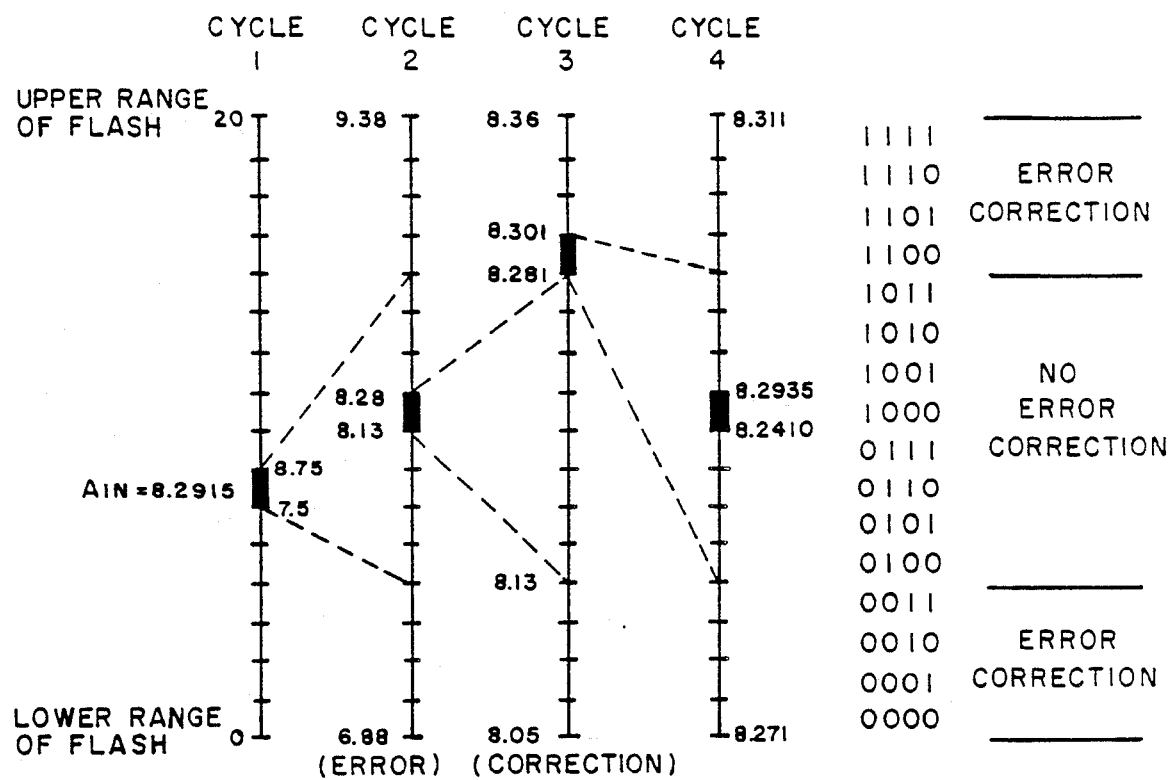

FIGS. 3A and 3B illustrate in graphical format how the multi-cycle conversion process is carried out, using an input signal $A_{IN} = 8.2915$ V as exemplary. The chart-like presentation comprises in each figure a set of four vertical bars each presenting information about a corresponding one of the four sequential cycles of sub-ranging conversion. Each vertical bar is subdivided into 16 segments representing the 16 possible values of the net output of the 4-bit flash converter 34 for each cycle (including previous cycles). The 4-bit code for each such possible value is shown in a column to the right of the graphic displays.

The right-hand code column in both FIGS. 3A and 3B comprises a central section, labelled "no error correction" and containing eight codes, and two outer sections of four codes each, labelled "error correction". When there is no error during the entire conversion (i.e. no error beyond the expected $\pm \frac{1}{2}$ LSB uncertainty), all of the flash converter codes will fall within the central section of eight codes. If there is an error in any cycle beyond the expected uncertainty, however, the flash code developed in the immediately following cycle will fall within one of the outer sections of codes, as the converter carries out a correction of the error in a manner to be described.

Turning first to FIG. 3A, there is shown a conversion sequence where it is assumed that no error occurs in converting an input of 8.2915 V into the corresponding 12-bit digital number. In the 1st cycle, the flash converter 34 produces a 4-bit output of 0110, indicating that the input voltage is between 7.5 and 8.75 volts (this range is C shown in the first vertical bar as segment #7, counting from the bottom). The last three bits (110) are stored by the logic controls 80 in the first DAC register 84 (FIG. 2). The MSB of the 4-bit signal is a zero, and is not stored because it contains no information. That is, because the full-scale input voltage of 10 volts is fully represented by the last 3 bits of the 4-bit flash code, the MSB produced by the flash converter has no significance.

In the 2nd conversion cycle, the effective gain of the system is increased by a factor of 8 (equivalent to 3-bits). Thus in the 2nd cycle, the central eight-code range of the flash converter 34 (i.e. the section labelled "no error correction") now represents the previous one-code range (segment #7) selected in the 1st cycle. That is, the full-scale normal output of the flash converter (the 8-segment section comprising segments 5 through 12) provides an 8-times amplified version of the single-segment range (segment 7) of the 1st cycle. In the particular example portrayed, the flash converter 34 determines that the residue of the analog input signal lies in segment #10, that is, between 8.28 and 8.44 volts. The corresponding flash code is 1001.

This sub-ranging process is repeated twice more, in cycles 3 and 4, with the gain increased by a factor of 8:1 in each case, and each additional cycle adding 3 more information bits to the final result. Specifically, in the 3rd cycle the flash converter determines that the residue value falls into the 5th segment, between 8.281 and 8.301 volts, with a flash code of 0100. In the 4th cycle, the flash converter determines that the residue value lies in the 9th segment, between 8.2910 and 8.2935 volts, with a flash code of 1000.

Just beneath the graphic presentation of FIG. 3A, there is a table giving the flash codes generated for the successive cycles, with each code positioned horizontally in accordance with the weight to be accorded the bits of that code for the particular cycle. It will be noted that in cycle #2, the residue was positive, so that a "1" was produced in the MSB position, and thus the "overlap" bit was turned on. At the end of all four cycles, the total (composite) binary output signal is developed by processing the individual flash code outputs through the usual digital addition techniques (as by conventional full adder means A in the logic controls 80, FIG. 2), producing a 12-bit final digital output signal corresponding to the input signal $A_{IN}=8.2915$ volts. This 12-bit output is shown at the bottom of the table beneath the graphic portion of FIG. 3A as a summation of the individual flash codes generated during the four conversion cycles.

FIG. 3B illustrates the conversion sequences which occur in the event of an error at some stage in the processing. Here, the exemplary error is in the 2nd cycle, where the flash converter 34 produced an erroneous code 1000 (the 9th segment from the bottom) rather than code 1001 (the 10th segment from the bottom) as in the example of FIG. 3A. This error alters the magnitude of the DAC signal ($I_{DAC}$) directed to the summing node 16, and thereby alters the residue signal at that point, and at the input to the transistor 46.

Due to this error, when the residue signal thereafter is determined during the 3rd cycle, the flash converter produces a code different from that produced in the FIG. 3A example. In the specific case, the flash converter produces the code 1100, corresponding to the 13th segment of the vertical bar. This code lies outside of the normal (non-error) eight-segment range of the flash converter, as can be seen from the column of codes to the right of the vertical bars of FIG. 3B.

This 3rd cycle code (1100) differs from that developed during the 3rd cycle of FIG. 3A (0100), and the difference is just precisely that needed to correct (compensate for) the erroneous code of 1001 developed during the 2nd cycle of FIG. 3B. This can be seen from the tables beneath the graphic displays of FIGS. 3A and 3B, where it will be seen that the addition of the 2nd and 3rd codes 1001 and 0100 of FIG. 3A will produce the same value as the addition of the 2nd and 3rd cycle codes 1000 and 1100 of FIG. 3B.

With the 2nd cycle error fully corrected in the 3rd cycle, the 4th cycle will produce a result identical to that in the 4th cycle in the non-error example of FIG. 3A. In that regard, it may particularly be noted that in the 3rd vertical bar of FIG. 3B the lower and upper voltage limits of the selected segment (segment 13, with limit voltages of 8.281 and 8.301) are the same as the corresponding limit voltages of the selected (5th) segment of the 3rd cycle in the example of FIG. 3A. Thus, during the fourth cycle of FIG. 3B, the central section of eight codes (i.e. from the 5th segment to the 12th segment, or from code 0100 to code 1011), of the flash converter spans the same voltage range as was spanned during the 4th cycle of the FIG. 3A example. Accordingly, the flash converter in the FIG. 3B 4th cycle produces the same code (1000) as it did during the example of FIG. 3A. And, since the erroneous 2nd cycle code of 1000 was completely compensated for by the altered 3rd cycle code 1100, the final composite digital number is the same as in FIG. 3A, as shown at the summation of the four flash codes at the bottom of the two tables, respectively.

It will be understood from the above that the error correction capability illustrated in FIG. 3B is made possible particularly by providing the flash converter 34 with an enlarged flash range capability, i.e. greater than that required to handle normal non-error conditions. For example, in the preferred embodiment, the effective gain for each successive cycle is increased by a factor of 8:1 (or 3-bits), and thus a 3-bit flash converter would be capable of effective operation in each cycle providing there are no errors of a magnitude beyond the expected $\pm \frac{1}{2}$ LSB uncertainty. However, in accordance with an important aspect of the present embodiment, the range of the flash converter is expanded to a value greater than 3-bits, specifically to 4-bits, and this additional range makes possible the correction of errors of $\pm 1$ LSB during normal processing.

When the A/D converter is switched into its 3rd cycle of operation (by timing signals from the logic controls 80), the gain of the residue amplifier 18 (and the reference amplifier 18A) is increased by a factor of 64:, by switching the load resistor $R_G$ from its initial value of 1.25K to 80K. This increase in load resistance also has the effect of reducing the bandwidth of the amplifier, but not enough to significantly affect the speed of operation in achieving settling of the 4-bit flash converter output. In the 4th cycle, however, the bandwidth is purposely reduced by a substantial amount, as by connecting in parallel with the load resistors $R_G$ respective capacitors 110, 110A through operation of switches 112, 112A by the timing circuitry of controls 80. This reduces the bandwidth from about 6 MHz to about 800 kHz, for the purpose of reducing the effects of noise on the performance of the flash converter. This bandwidth reduction also has the unwanted effect of slowing down the conversion, i.e. it increases the settling time. However, the increased settling time affects only the 4th cycle of conversion significantly.

At the end of the 4th cycle of operation, as noted above, the controls 80 complete a digital summation operation on all of the bits stored in the registers 82. This summation is carried out by a full adder A which operates continuously after digital data starts to accumulate. The sequencing of the converter from one cycle to the next does not, however, await the results of this digital addition, so that the converter completes its conversion without inter-cycle delay, thus assuring a high speed of operation. The final result is a 12-bit number representing the value of the analog input signal delivered to the A/D converter.

As described in the introductory portion of this specification, the converter may be arranged to carry out a 5th cycle of operation. Such 5th cycle in the preferred embodiment is carried out with an effective resolution (gain) increased by a factor of 4 relative to the previous cycle. This increased resolution is produced by decreasing the current $I_R$ flowing through the networks 50, 50A, as by conventional circuit means (not shown) responsive to timing signals from the controls 80. In the preferred embodiment, the current $I_R$ was reduced from 500 $\mu$A, in cycles 1–4, to 125 $\mu$A in the 5th cycle. The capacitors 110, 110A remain connected in parallel with the load resistors $R_G$.

After the current $I_R$ is decreased by a factor of 4, the 5th cycle is carried out generally in the same manner as in the first cycles 1–4. That is, the DAC 32 is updated, so that the output $I_{DAC}$ will be the sum of all of the current sources 92 activated in response to the stored bits in all of the registers 82 during the first 4 cycles. This current is compared to the input signal to produce a new residue signal which, as before, is directed to the flash converter 34 to develop a new 4-bit signal on lines 74.

This new 4-bit signal is combined digitally with the 12-bit number developed at the end of the 4th cycle, for example, by another full adder B in controls 80. It may be noted that because the 5th 4-bit flash signal was developed with a gain increase of only 4:1 over the 4th cycle, its two most significant bits overlap the last two bits of the 12-bit number. The incorporation of these two most significant bits from the 5th cycle into the 12 bit output may if desired serve to upgrade the 12-bit performance of the converter, with the new 3rd and 4th bits discarded. Alternatively, the 3rd and 4th bits of the new 4-bit signal may be added at the end of the final 12-bit number to provide a 14-bit output from the converter.

As will be noted in the description hereinabove, the cyclic sequencing of the A/D converter of this invention requires that a number of switching operations be performed. One of the features of the apparatus developed for carrying out the present invention is the use of current-source switching for effecting necessary circuit alterations. For example, in shifting from cycle #1 to cycle #2, the current flowing through the strings of resistors 52, 52A must be decreased from 125 μA (giving 78.125 mV between taps) to 15.625 μA (giving 9.76 mV between taps). This advantageously is carried out by switches diagrammatically illustrated at 60, 60A which divert the output current of current sources 58, 58A between respective terminal points of the networks 50, 50A. Such current-source switching can readily be implemented by appropriate IC circuitry making for a convenient solution to the switching problem.

Although a specific preferred embodiment has been described hereinabove in detail, it is to be understood that this is for the purpose of illustrating the principles of the invention, and should not be considered limiting, since it is apparent that those skilled in this art can make many modifications to the disclosed embodiment to suit particular applications while still making use of the invention within its full scope as set forth in the claims hereof.

What is claimed is:

1. An A/D converter comprising:
   a flash converter including a plurality of comparators each having first and second input terminals;
   first and second resistance networks for said flash converter, each having a set of output nodes;
   said first input terminals being connected to respective output nodes of said first resistance network;
   said second input terminals being connected to respective output nodes of said second resistance network;
   first and second bias current means connected to said first and second resistance networks respectively to produce voltage differentials between said output nodes thereof;
   means connecting an analog input signal to said first resistance network to produce corresponding voltages on the output nodes thereof so as to activate said comparators in a pattern representing said input signal; and
   means responsive to the output of said comparators to produce a digital output signal corresponding to said input signal.

2. Apparatus as claimed in claim 1, wherein said first and second resistance networks are identical.

3. Apparatus as claimed in claim 1, wherein said first and second networks present equal source impedances to said first and second comparator input terminals respectively.

4. Apparatus as claimed in claim 1, including switch means for changing the points of connection of said bias current means to said networks, respectively, to change the range of said flash converter correspondingly.

5. Apparatus as claimed in claim 1, wherein each of said networks comprises a string of equal resistors.

6. Apparatus as claimed in claim 5, including sets of additional resistors connected in parallel with said strings of resistors respectively to produce equal source impedances for said output nodes.

7. Apparatus as claimed in claim 1, wherein each of said networks comprises a string of resistors with the common connections thereof providing said output nodes;
   a D/A converter having its input controlled by the output of said flash converter;
   means summing the output of said D/A converter with said analog input signal to produce a residue signal representing the difference therebetween; and
   means coupling said residue signal to said first network to produce said corresponding voltages on said output nodes.

8. Apparatus as claimed in claim 7, including control means for cycling said converter through a series of sub-ranging cycles wherein during the first cycle said flash converter develops a first set of higher order output bits to control said D/A converter, and in subsequent cycles said flash converter produces lower order sets of output bits for said D/A converter, tending to reduce said residue signal to zero;
   the first comparator of said plurality of comparators being bridged between an upper end node of said first resistance network and a lower end node of said second resistance network;
   the next and succeeding comparators being bridged, respectively, between successively lower nodes of said first network and successively higher nodes of said second network;
   said networks and said bias means being so related that a center comparator of said plurality of comparators is the decision-making comparator when said residue signal approaches zero.

9. Apparatus as claimed in claim 8, wherein said center comparator of said plurality of comparators is bridged between a center node of one of said networks and a node of said second network which is offset by one from the center of that network.

10. Apparatus as claimed in claim 8, wherein said string resistors of said networks are of equal value.

11. An A/D converter comprising:
    an input circuit for receiving an analog input signal;
    a flash converter including a plurality of comparators each having first and second input terminals;
    a D/A converter having its digital input controlled by the output of said flash converter and having its analog output connected to said input circuit to be summed with said analog input signal, thereby to produce a residue signal reflecting the difference between said analog signal and said D/A converter output;
    a residue amplifier for amplifying said residue signal;
    first circuit means having an input to receive said residue signal and to supply corresponding signals to said first comparator input terminals;
    a reference amplifier identical in electrical characteristics to said residue amplifier and supplying a reference output signal; and
    second circuit means having an input for receiving said reference output signal and supplying corresponding reference signals to said second comparator input terminals.

12. Apparatus as claimed in claim 11, wherein said amplifiers are operated open loop with respect to said residue and reference signals.

13. Apparatus as claimed in claim 12, wherein each of said amplifiers comprises:
   a load resistor connected between a power supply lead and one current electrode of a transistor means;
   an op amp having one input connected to the other current electrode of said transistor means and serving as a summing node;
   a bias current source connected to said other current electrode; and
   means connecting the output of said op amp to the control electrode of said transistor means to force the bias current to flow through said transistor means to said load resistor.

14. Apparatus as claimed in claim 13, including means for supplying to said summing node an input current corresponding to said analog input current.

15. Apparatus as claimed in claim 14, wherein the output of said D/A converter is connected to said summing node.

16. An A/D converter comprising:
   an input circuit to receive an analog signal to be converted;
   a flash converter including a plurality of comparators to receive first and second inputs to be compared so as to produce a corresponding digital signal;
   first circuit means responsive to said analog signal to develop said first comparator inputs;
   said first circuit means comprising a D/A converter having its output summed with said input signal to produce a residue signal for controlling said first comparator inputs;
   means coupling the output of said flash converter to the input of said D/A converter;
   second circuit means for developing said second comparator inputs;
   one of said circuit means further comprising a resistor network and having a plurality of output nodes to be coupled to corresponding inputs of said comparators;
   a source of bias current for said one resistor network to develop voltage differentials between said output nodes;
   range-changing means to change a characteristic of the bias current flowing through said network so as to change the voltage differentials between said output nodes, thereby to change the range of said flash converter;
   control means for operating said converter through at least two successive cycles wherein in one cycle said flash converter range is set by said bias current at a first magnitude while the converter develops a first set of higher order bits as an output of said flash converter, and in a second cycle the range is set at a second magnitude while the converter develops as an output of said flash converter a second set of bits of lower order than said first set; and
   means for combining said first and second sets of bits to produce a composite digital output signal for said A/D converter.

17. Apparatus as claimed in claim 16, wherein said one resistor network comprises a string of series-connected resistors with said output nodes at the common junctions thereof;
   said range-changing means comprising means to alter the magnitude of the current flowing through said string of resistors.

18. Apparatus as claimed in claim 17, wherein said one resistor network comprises a set of resistors connected in parallel with said resistor string;
   said range-changing means comprising means to alter the point at which said source of bias current is connected to said network.

19. Apparatus as claimed in claim 16, wherein each of said circuit means comprises a resistor network having output nodes to produce voltages for respective inputs of said comparators.

20. Apparatus as claimed in claim 19, wherein each of said networks comprises a string of resistors with said output nodes at the common junctions thereof; and
   bias current sources for both of said networks to produce current flow through both of said resistor strings.

21. Apparatus as claimed in claim 20, wherein said range-changing means comprises means to alter the bias currents flowing through both of said resistor strings.

22. Apparatus as claimed in claim 16, wherein said first circuit means comprises a residue amplifier having its input coupled to the output signal of said D/A converter and to said analog input signal so that the amplifier output reflects the residue difference between those two signals;
   said amplified residue signal controlling the first comparator inputs;
   said second circuit means comprising a reference amplifier having an output controlling said second comparator inputs.

23. Apparatus as claimed in claim 22, wherein said range-changing means further comprises means to alter the gain of both said residue and reference amplifiers.

24. Apparatus as claimed in claim 23, wherein said control means comprises means to operate said A/D converter through at least three cycles wherein said range-changing means is operable in one of the cycles following the first cycle to change the gain of both said residue and reference amplifiers.

25. Apparatus as claimed in claim 24, wherein said range-changing means is operable in the second cycle to alter said bias current characteristic to change the range of the flash converter;
   said range-changing means being operable in the third cycle to restore said bias current characteristic to its initial state, and to alter the gain of said residue and reference amplifiers to correspondingly change the range of the flash converter.

26. Apparatus as claimed in claim 24, wherein said control means operates said A/D converter through at least four cycles;
   said range-changing means being operable in the fourth cycle to alter said bias current characteristic to the same state as in said second cycle while maintaining the gain of said amplifier as in said third cycle.

27. An A/D converter comprising:
   an input circuit to receive an analog signal to be converted;
   a flash converter including a plurality of comparators to receive first and second inputs to be compared so as to produce a corresponding digital signal;

first circuit means responsive to said analog signal to develop said first comparator inputs;

said first circuit means comprising a D/A converter having its output summed with said input signal to produce a residue signal for controlling said first comparator inputs;

means coupling the output of said flash converter to the input of said D/A converter;

said first circuit means further comprising a residue amplifier producing an amplified residue signal to control said first comparator inputs;

second circuit means for developing said second comparator inputs;

range-changing means to change the effective gain of said residue amplifier comprising:
(1) first and second transistor amplifiers having different gains;
(2) an op amp receiving said residue signal;
(3) first and second feedback circuits selectively activatable to couple the outputs of said op amp to an input terminal of said first or said second transistor amplifiers respectively with a current output terminal of such transistor amplifier coupled to the input of said op amp, whereby the current through the selected transistor amplifier will correspond to said residue signal;
(4) switch means for selectively activating either said first or said second feedback circuit, so that the residue signal is amplified by either said first or said second transistor amplifier; and control means for operating said converter through at least two cycles wherein in one cycle said residue amplifier gain is set by said range-changing means at a first value while said flash converter develops a first set of higher order bits, and in a second cycle the gain of said residue amplifier is increased by operating said switch means of said range-changing means to set the range at a second value while the flash converter develops a second set of bits of lower order than said first set; and means for combining said first and second sets of bits to produce a composite digital output signal for said A/D converter.

28. Apparatus as claimed in claim 27, wherein said transistor amplifiers have load resistors of different values to produce said different gains.

29. Apparatus as claimed in claim 28, wherein said transistor amplifiers comprise first and second transistors respectively;

the emitters of said transistors being connected to said summing node;

the collectors of said transistors being coupled through said different-valued load resistors to a power supply line; and the bases of said transistors being coupled through said switch means to the output of said op amp.

* * * * *